(12) United States Patent
Pan et al.

(10) Patent No.: US 8,255,729 B2
(45) Date of Patent: Aug. 28, 2012

(54) TIME SEQUENCE CONTROL CIRCUIT

(75) Inventors: Ai-Yu Pan, Shenzhen (CN); Chao-Rong Lai, Shenzhen (CN); Cheng-Yang Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 276 days.

(21) Appl. No.: 12/768,572

(22) Filed: Apr. 27, 2010

(65) Prior Publication Data

US 2011/0169467 A1    Jul. 14, 2011

(30) Foreign Application Priority Data

Jan. 14, 2010  (CN) .......................... 2010 1 0300314

(51) Int. Cl.
*G06F 1/26* (2006.01)

(52) U.S. Cl. ......................................... 713/330; 323/284
(58) Field of Classification Search .................. 713/330, 713/503, 300; 323/282–284, 311
See application file for complete search history.

(56) References Cited

U.S. PATENT DOCUMENTS

| | | | | |
|---|---|---|---|---|
| 7,594,130 | B1* | 9/2009 | Hu | ................. 713/300 |
| 7,853,810 | B2* | 12/2010 | Huang et al. | ................. 713/300 |
| 7,917,786 | B2* | 3/2011 | He et al. | ..................... 713/320 |
| 2010/0211811 | A1* | 8/2010 | Zhou et al. | ..................... 713/330 |

* cited by examiner

*Primary Examiner* — Glenn A Auve
(74) *Attorney, Agent, or Firm* — Altis Law Group, Inc.

(57) ABSTRACT

A time sequence control circuit is provided to control time sequence of a motherboard of a computer. A first voltage received by a power supply receiving terminal is greater than a preset voltage before a signal control terminal on the motherboard receives a second voltage during turning on the computer. During shutting off the computer, the first voltage at the power supply receiving terminal drops and is less than the preset voltage, and the second voltage supplied to the signal control terminal on the motherboard is shut off.

9 Claims, 1 Drawing Sheet

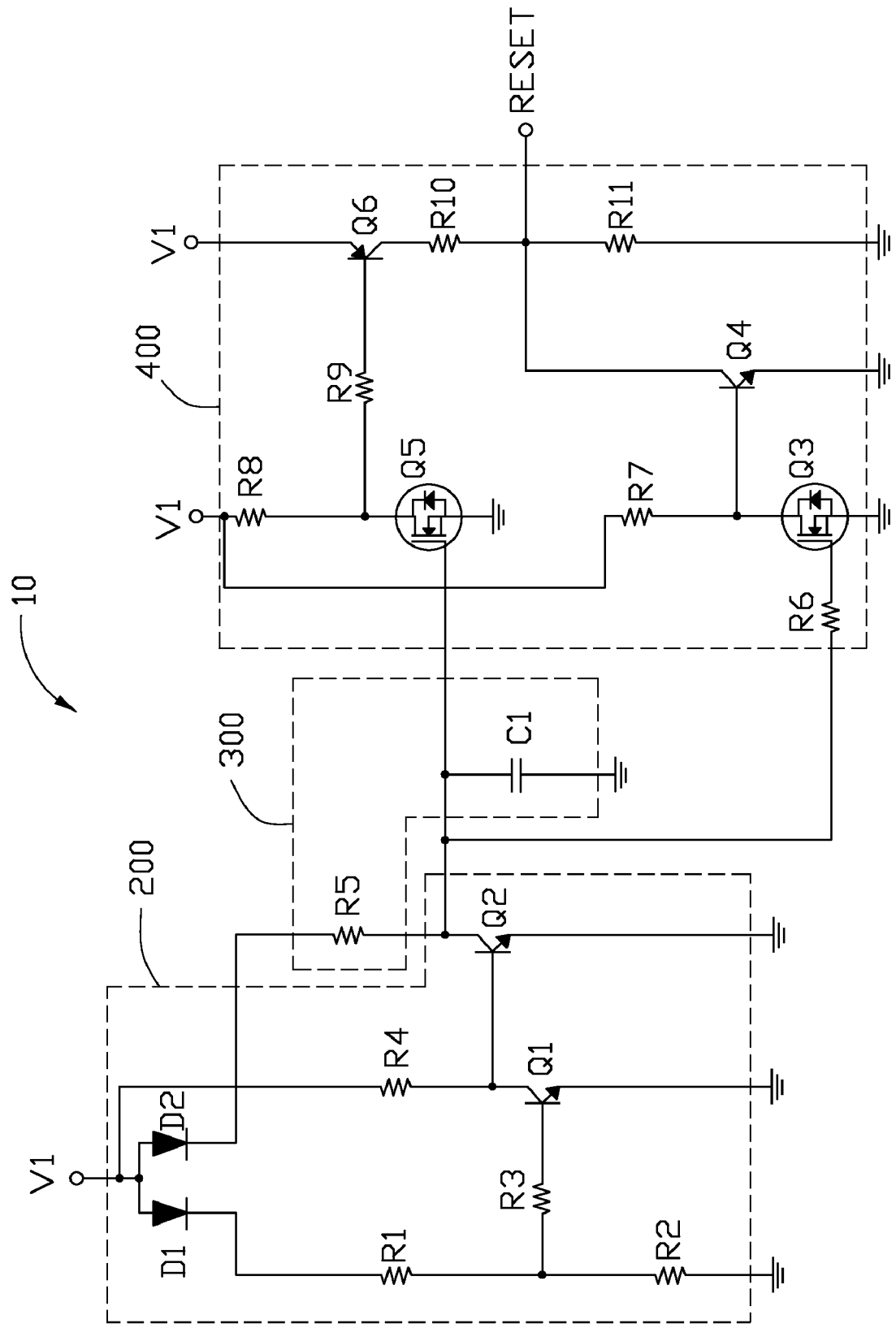

TIME SEQUENCE CONTROL CIRCUIT

BACKGROUND

1. Technical Field

The present disclosure relates to control circuits, and particularly to a time sequence control circuit of a motherboard of a computer.

2. Description of Related Art

Operation of an electronic device or a component, such as a motherboard of a computer, may have special time sequence requirements during turning on or shutting off of the computer. Generally, time sequence of the component can keep the computer working normally. For example, when the computer is turned on, a 3.3 volt (V) power supply receiving terminal may receive a first voltage greater than a preset voltage (e.g., 2.7V) before a reset signal terminal on the motherboard receives a 2.8V power supply voltage; and when the computer is shut off, the 3.3V power supply receiving terminal may drop and be less than the preset voltage and a voltage signal to the reset signal terminal on the motherboard is shut off. However, if the time sequence is not followed, the computer may not work properly.

BRIEF DESCRIPTION OF THE DRAWING

Many aspects of the present embodiments can be better understood with reference to the following drawing. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

The drawing is a circuit diagram of an exemplary embodiment of a time sequence control circuit.

DETAILED DESCRIPTION

The disclosure is illustrated by way of example and not by way of limitation in the FIGURES of the accompanying drawing in which like references indicate similar elements. It should be noted that references to "an" or "one" embodiment in this disclosure are not necessarily to the same embodiment, and such references mean at least one.

Referring to the drawing, an exemplary embodiment of a time consequence control circuit 10 is provided for controlling time sequence of a motherboard of a computer during turning on or shutting off the computer. The circuit 10 includes a control circuit 200, a delay circuit 300, and a power conversion circuit 400.

The control circuit 200 is connected to a power supply receiving terminal V1 to receive a first voltage, and is also connected to the power conversion circuit 400 via the delay circuit 300. The power conversion circuit 400 is connected to a signal control terminal RESET on the motherboard. The power conversion circuit 400 converts the first voltage into a second voltage to be provided to the motherboard via the signal control terminal RESET. In this embodiment, the first voltage is a direct current (DC) voltage which gradually increases from 0 volts (V) to a maximum voltage (e.g., 3.3V) after the computer is turned on, and gradually drops to 0V after the computer is shut off, the signal control terminal RESET is a reset signal control terminal of the motherboard. In other embodiments, the first voltage can be other values, and the signal control terminal RESET can be another type of signal control terminal.

The control circuit 200 includes two diodes D1 and D2, two transistors Q1 and Q2, and four resistors R1-R4. Anodes of the diodes D1 and D2 are connected to the power supply receiving terminal V1. A cathode of the diode D1 is grounded via the resistors R1 and R2 connected in series. A cathode of the diode D2 is connected to the delay circuit 300. A base of the transistor Q1 is connected to a node between the resistors R1 and R2 via the resistor R3. An emitter of the transistor Q1 is grounded. A collector of the transistor Q1 is connected to a base of the transistor Q2, and is also connected to the power supply receiving terminal V1 via the resistor R4. An emitter of the transistor Q2 is grounded. A collector of the transistor Q2 is connected to the delay circuit 300 and the power conversion circuit 400. In this embodiment, the transistors Q1 and Q2, functioning as electronic switches are npn bipolar junction transistors. In other embodiments, the transistors Q1 and Q2 can be other type of electronic switches, such as n-channel metal oxide semiconductor field effect transistors (NMOSFETs).

The delay circuit 300 includes a resistor R5 and a capacitor C1. The resistor R5 is connected between the cathode of the diode D2 and the collector of the transistor Q2. The capacitor C1 is connected between the collector of the transistor Q2 and ground.

The power conversion circuit 400 includes four transistors Q3-Q6 functioning as electronic switches and six resistors R6-R11. In one embodiment, the transistors Q3 and Q5, are NMOSFETs, the transistor Q4 is an npn bipolar junction transistor, and the transistor Q6 is a pnp transistor. A gate of the transistor Q3 is connected to the collector of the transistor Q2 via the resistor R6. A source of the transistor Q3 is grounded. A drain of the transistor Q3 is connected to a base of the transistor Q4, and is also connected to the power supply receiving terminal V1 via the resistor R7. An emitter of the transistor Q4 is grounded. A collector of the transistor Q4 is connected to the signal control terminal RESET. A gate of the transistor Q5 is connected to the collector of the transistor Q2. A source of the transistor Q5 is grounded. A drain of the transistor Q5 is connected to the power supply receiving terminal V1 via the resistor R8, and is also connected to a base of the transistor Q6 via the resistor R9. An emitter of the transistor Q6 is connected to the power supply receiving terminal V1. A collector of the transistor Q6 is grounded via the resistors R10 and R11 connected in series. A node between the resistors R10 and R11 is connected to the signal control terminal RESET.

In other embodiments, the transistors Q3 and Q5 can be other types of electronic switches, such as npn bipolar junction transistors, the transistor Q4 can be another type of electronic device, such as an NMOSFET, and the transistor Q6 can be another type of electronic switch, such as a p-channel metal oxide semiconductor field effect transistor (PMOSFET).

When the computer is turned on, the first voltage at the power supply receiving terminal V1 increases from 0V to 0.3V, the diodes D1 and D2 are turned on, voltage at the base of the transistor Q1 is less than a threshold voltage, such as 0.6V, and the transistor Q1 is turned off. When the first voltage at the power supply receiving terminal V1 increases to the preset voltage, such as 2.7V, the diodes D1 and D2 remain on, voltage at the base of the transistor Q1 is equal to or greater than the threshold voltage, and the transistor Q1 is turned on. The base of the transistor Q2 is at low level, such as 0V, and the transistor Q2 is turned off. The power supply receiving terminal V1 charges the capacitor C1 via the resistor R5. During charging of the capacitor C1, the first voltage at the power supply receiving terminal V1 increases to 3.3V. After the capacitor C1 is charged for a period of time, voltage between the gates and the sources of the transistors Q3 and Q5 increase to a conduction voltage, respectively, and the transistors Q3 and Q5 are turned on. The bases of the transistors Q4 and Q6 are at low level, such as 0V, the transistor Q4 is turned off, and the transistor Q6 is turned on. The signal control terminal RESET is at high level, such as 2.8V. Therefore, after the first voltage at the power supply receiving terminal V1 increases to the preset voltage, the signal control terminal RESET receives the second voltage (e.g., a 2.8V voltage) after delaying for a period of time, and the period of time is equal to the charge time of the capacitor C1.

When the computer is shut off, the first voltage at the power supply receiving terminal V1 drops and is less than the preset voltage (2.7V), the diodes D1 and D2 are still turned on. Voltage at the base of the transistor Q1 is less than 0.6V, and the transistor Q1 is turned off. The base of the transistor Q2 is at high level, such as 2.5V, and the transistor Q2 is turned on. The capacitor C1 is discharged via the transistor Q2, and the transistors Q3 and Q5 are turned off, the base of the transistors Q4 and Q6 are at high level, such as 3.3V. The transistor Q4 is turned on, the transistor Q6 is turned off, and the signal control terminal RESET is at low level, such as 0V.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A time sequence control circuit for controlling a first voltage received by a power supply receiving terminal of a motherboard of a computer greater than a preset voltage before a signal control terminal on the motherboard receives a second voltage during turning on the computer, the control circuit comprising:
   a control circuit connected to the power supply receiving terminal to receive the first voltage;
   a delay circuit connected to the control circuit; and
   a power conversion circuit connected between the delay circuit and the signal control terminal, to convert the first voltage into the second voltage;
   wherein the control circuit comprises first and second diodes, and first and second electronic switches, anodes of the first and second diodes are connected to the power supply receiving terminal, a cathode of the first diode is grounded via first and second resistors connected in series, a cathode of the second diode is connected to the delay circuit, a first terminal of the first electronic switch is connected to a node between the first and second resistors, a second terminal of the first electronic switch is grounded, a third terminal of the first electronic switch is connected to a first terminal of the second electronic switch, and is also connected to the power supply receiving terminal via a third resistor, a second terminal of the second electronic switch is grounded, a third terminal of the second electronic switch is connected to the delay circuit; when the computer is turned on, the first voltage increases to the preset voltage, the first terminal of the first electronic switch is at high level, the first electronic switch is turned on, the first terminal of the second electronic switch is at a low level, and the second electronic switch is turned off; and wherein when the computer is turned on, the power supply receiving terminal increases to the preset voltage, the control circuit is turned off, the power conversion circuit converts the first voltage into the second voltage and provides the second voltage to the signal control terminal after delaying for a period of time.

2. The control circuit of claim 1, wherein the first and second electronic switches are npn bipolar junction transistors, and the first to third terminals of the first and second electronic switches are bases, emitters, and collectors of the npn bipolar junction transistors.

3. The control circuit of claim 1, wherein the third terminal of the first electronic switch is connected to the node between the first and second resistors via a fourth resistor.

4. The control circuit of claim 1, wherein the delay circuit comprises a fourth resistor and a capacitor, the fourth resistor is connected between the cathode of the second diode and the third terminal of the second electronic switch, and the capacitor is connected between the third terminal of the second electronic switch and ground.

5. The control circuit of claim 4, wherein the power conversion circuit comprises third to sixth electronic switches, a first terminal of the third electronic switch is connected to the third terminal of the second electronic switch via a fifth resistor, a second terminal of the third electronic switch is grounded, a third terminal of the third electronic switch is connected to a first terminal of the fourth electronic switch, and is also connected to the power supply receiving terminal via a sixth resistor, a second terminal of the fourth electronic switch is grounded, a third terminal of the fourth electronic switch is connected to the signal control terminal, a first terminal of the fifth electronic switch is connected to the third terminal of the second electronic switch, a second terminal of the fifth electronic switch is grounded, a third terminal of the fifth electronic switch is connected to the power supply receiving terminal via a seventh resistor, and is also connected to a first terminal of the sixth electronic switch via an eighth resistor, a second terminal of the sixth electronic switch is connected to the power supply receiving terminal, a third terminal of the sixth electronic switch is grounded via a ninth and a tenth resistors, a node between the ninth and tenth resistors is connected to the signal control terminal; wherein when the computer is turned on, the first voltage increases to the preset voltage, the third and fifth electronic switches are turned on after delayed for a period of time by the delay circuit, the first terminals of the fourth and sixth electronic switches are at low level, the fourth electronic switch is turned off, the sixth electronic switch is turned on, and the signal control terminal receives the second voltage.

6. The control circuit of claim 5, wherein the third and fifth electronic switches are re-channel metal oxide semiconductor field effect transistors (NMOSFETs), and the first to third terminals of the third and fifth electronic switches are gates, sources, and drains of the NMOSFETs, respectively.

7. The control circuit of claim 5, wherein the fourth and sixth electronic switches are npn and pnp bipolar junction transistors, respectively, and the first to third terminals of the fourth and sixth electronic switches are bases, emitters, and collectors of the npn and pnp bipolar junction transistors, respectively.

8. The control circuit of claim 1, wherein a maximum voltage of the first voltage is 3.3 volts.

9. The control circuit of claim 1, wherein the preset voltage is 2.7 volts.

* * * * *